United States Patent
Wiening et al.

(10) Patent No.: US 10,037,404 B2
(45) Date of Patent: Jul. 31, 2018

(54) FEATURE CLONING BASED ON GEOMETRIC SEARCH

(71) Applicants: Dassault Systemes Simulia Corp., Providence, RI (US); Dassault Systemes SolidWorks Corporation, Waltham, MA (US)

(72) Inventors: Jonathan Wiening, Providence, RI (US); David Perkins, Mason, OH (US); Li-Ling Huang, Woodland Hills, CA (US); Peter Liberman, Woodland Hills, CA (US)

(73) Assignee: DASSAULT SYSTEMES SIMULIA CORP., Johnston, RI (US)

( * ) Notice: Subject to any disclaimer, the term of this patent is extended or adjusted under 35 U.S.C. 154(b) by 872 days.

(21) Appl. No.: 14/488,469

(22) Filed: Sep. 17, 2014

(65) Prior Publication Data
US 2016/0078150 A1    Mar. 17, 2016

(51) Int. Cl.
*G06F 17/50* (2006.01)

(52) U.S. Cl.
CPC ................. *G06F 17/5086* (2013.01)

(58) Field of Classification Search
CPC .................. G06F 3/04842; G06F 17/5086
See application file for complete search history.

(56) References Cited

U.S. PATENT DOCUMENTS

| 6,219,049 | B1* | 4/2001 | Zuffante | G06F 17/50 345/420 |
| 2008/0111813 | A1* | 5/2008 | Gatzke | G05B 19/41805 345/419 |
| 2008/0222568 | A1* | 9/2008 | Okuwaki | G06F 17/50 715/825 |
| 2011/0214091 | A1* | 9/2011 | Nicol | G06F 3/0482 715/838 |
| 2014/0074272 | A1* | 3/2014 | Cowden, IV | G06F 17/50 700/97 |
| 2014/0379309 | A1* | 12/2014 | Banta | G06F 17/50 703/1 |
| 2015/0248211 | A1* | 9/2015 | Johnson | G06F 3/04815 715/848 |

OTHER PUBLICATIONS

Dassault Systems, "2011 SolidWorks—Smart Fasteners Overview" (Mar. 14, 2012), pp. 1-8 [retrieved fromhttps://web.archive.org/web/*/http://help.solidworks.com/2011/English/SolidWorks/sldworks/LegacyHelp/Sldworks/Assem_1/Smart_Fasteners_Overview.htm].*

Lombard, "SoildWorks 2011 Assemblies Bible" (2011), Wiley, pp. 327-335 [retrieved from https://ebookcentral.proquest.com/lib/uspto-ebooks/detail.action?docID=698029].*

(Continued)

*Primary Examiner* — Brian W Wathen
(74) *Attorney, Agent, or Firm* — Hamilton, Brook, Smith & Reynolds, P.C.

(57) ABSTRACT

A method of cloning models of a physical fastener may include a computer-aided design (CAD) system receiving one or more instructions that identify a base model of a physical fastener. For each of one or more socket models having at least one characteristic corresponding to the base model, the method may further include generating a clone fastener model based on the base model of a physical fastener and at least one physical property of the one or more socket models.

20 Claims, 6 Drawing Sheets

(56) References Cited

OTHER PUBLICATIONS

SolidWorks, "SolidWorks Tim-Saving Tips: Feature-Driven Patterns" (Mar. 15, 2010), pp. 1-38 [retrieved from https://www.youtube.com/watch?v=9Mo1fOp-0xU].*

Tsai et al., "A two-stage fuzzy approach to feature-based design retrieval" (Jun. 2005), Computers in Industry, vol. 56, Issue 5, pp. 493-505 [retrieved from http://www.sciencedirect.com/science/article/pii/S0166361505000394].*

Bai et al., "Design reuse oriented partial retrieval of CAD models" (Dec. 2010), Computer-Aided Design, vol. 42, Issue 12, pp. 1069-1084 [retrieved from http://www.sciencedirect.com/science/article/pii/S0010448510001247].*

Dassault Systemes, "Design Simulation R2014xEnhancements", Nov. 8, 2013.

\* cited by examiner

FEATURE CLONING BASED ON GEOMETRIC SEARCH

BACKGROUND OF THE INVENTION

The approach of excluding the geometry of Computer-Aided Design (CAD)-modeled fasteners, and replacing them with virtual fasteners for purposes of simulation, is both well-known and available in many Computer-Aided Engineering (CAE) applications.

Virtual fasteners use the physical properties of the fasteners in the CAD model (e.g., applied load or torque, diameter of head, nut or thread to define their contact areas with non-fastener geometries) to expedite the Finite Element Analysis (FEA) process to provide efficient solutions while making those solutions as realistic as possible.

In many cases, however, users need to manually create and define such virtual fasteners individually. For a model with many fasteners, this manual process may take a long time to complete.

If the CAD model has no such fasteners defined, the user can skip the step of excluding the CAD-modeled fasteners. Without such fastener/connector information, however, an FEA application may not be capable of simulating the connection, thereby failing to provide a solution as described above.

A few techniques exist to massively create virtual fasteners, but each of these techniques has disadvantages. For example, some of the techniques may require substantial manual input of precisely defined parameters by the end user, and the massive creation itself is time consuming. Some techniques that may be tightly integrated with a particular CAD application do not work with imported geometry, and so cannot work with other CAD applications.

SUMMARY OF THE INVENTION

The described embodiments facilitate massive creation of virtual fasteners, while supporting ease of use and flexibility across different CAD systems. The described embodiments support a low complexity selection of a geometric entity to define an individual fastener for use in a target receptacle (i.e., socket) existing within a body or bodies defined by a CAD model (or 3D socket model). As used herein, the term "socket" refers to any opening (e.g., aperture, void, recess, etc.) that may facilitate insertion of a fastener. The described embodiments further support a low-complexity selection of an existing fastener, to clone that fastener for similar alternative receptacles that exist within the body or bodies.

In one aspect, the invention may be a method of generating a model of a physical fastener, which includes receiving, by a computer-aided design (CAD) system, one or more instructions identifying a geometric entity. The instructions may be, for example, from a CAD user, or from a data storage device. The method further includes generating a fastener model that includes the geometric entity and one or more associated elements. The one or more associated elements may depend on the geometric entity and characteristics of an associated socket model.

In one embodiment, the geometric entity represents at least a portion of an element of a fastener. In another embodiment, the geometric entity represents a bolt head, and the one or more associated elements represent at least one of a threaded body and a nut. In an embodiment, the one or more instructions are derived from a user performing a low-complexity action. In another embodiment, the low-complexity action includes a single click of a computer mouse.

In one embodiment, the association between the geometric entity and the socket model indicates a specific fastener to be used with a socket that the socket model represents. In another embodiment, characteristics of the fastener model correspond to at least one physical property derived from the socket model. The at least one physical property may include one or more of (i) head diameter, (ii) nut diameter, (iii) length of the socket, (iv) inside diameter of the socket, and (v) body radius.

One embodiment further includes creating a clone fastener model based on the generated fastener model. Characteristics of the clone fastener model may correspond to at least one physical property of the socket model.

In another aspect, the invention may be a method of cloning models of a physical fastener, including receiving, by a computer-aided design (CAD) system, one or more instructions identifying a base model of a physical fastener. The method further includes generating, for each of one or more socket models having at least one characteristic corresponding to the base model, a clone fastener model as a function of the base model and at least one physical property of the one or more socket models.

In one embodiment, the one or more instructions are derived from a user performing a low-complexity action. The low-complexity action may include a single click of a computer mouse. In another embodiment, the instructions identifying one or more socket models within the body model are generated by searching the body model for geometric primitives corresponding to the base model of a physical fastener, and identifying socket models that match the base model of a physical fastener. The match between the socket model and the base model of a physical fastener may be an exact match, or may be a fuzzy match.

One embodiment further including modifying one or more physical parameters of the clone fastener to match the associated socket model. In another embodiment, the one or more socket models within the body model are presented to the user as highlighted images in a graphical user interface of the CAD system.

In another aspect, the invention may be a non-transitory computer-readable medium with computer code instruction stored thereon. The computer code instructions, when executed by an a processor, may cause an apparatus to receive one or more instructions identifying a geometric entity. The computer code instructions, when executed by an a processor, may cause an apparatus to generate a fastener model including the geometric entity and one or more associated elements. The one or more associated elements may depend on the geometric entity and characteristics of an associated socket model.

In another aspect, the invention may be a non-transitory computer-readable medium with computer code instruction stored thereon. The computer code instructions, when executed by a processor, may cause an apparatus to receive one or more instructions identifying a base model of a physical fastener. The computer code instructions, when executed by an a processor, may cause an apparatus to generate, for each of one or more socket models having at least one characteristic corresponding to the base model, a clone fastener model as a function of the base model and at least one physical property of the one or more socket models.

DETAILED DESCRIPTION OF THE INVENTION

A description of example embodiments of the invention follows.

The described embodiments facilitate massive creation of virtual fasteners, while supporting ease of use and flexibility across different CAD systems. The described embodiments support a low complexity selection (e.g., one-button click) of a geometric entity to define an individual fastener for use in a target receptacle (i.e., socket) existing within a body defined by a CAD model.

The geometric entity may be a particular aspect of the socket. The aspect of the socket may include, for example, a conical face within the body that may contact a bolt head that is to be counter-sunk into the body. In another embodiment, the aspect of the socket may simply be an edge of the socket.

A one-button click of the bolt head initiates an automatic selection of other portions of the bolt to result in a complete fastener appropriate for the target receptacle.

The described embodiments further support a low-complexity selection (again, an example is a one-button click) of an existing fastener to clone that fastener for alternative, similar to the target receptacle, existing within the body.

Defining Individual Fastener

One embodiment facilitates a user defining a virtual fastener, where the user is working on a CAD model of a body alone, a set of bodies intended to be fastened together, or a body that is a component of a larger structure or system. Within the body (or bodies) is at least one socket (e.g., a hole in a flange or through an adjacent pair of flanges), referred to herein as a target socket, into which the user intends to deploy a fastener. In the described embodiment, the user may select, using a low-complexity action (e.g., a 1-button mouse click; a single click of a computer mouse), a geometric entity that corresponds to a portion of the fastener, in order to define an individual virtual fastener for the target socket. The geometric entity may be, for example, an edge or face of a target socket that would be a contact location for a portion of a fastener, such as a bolt head. The user may direct a display curser or other GUI indicator to the geometric entity (i.e., the face of the target socket) when performing the low-complexity action.

Figure 1A:
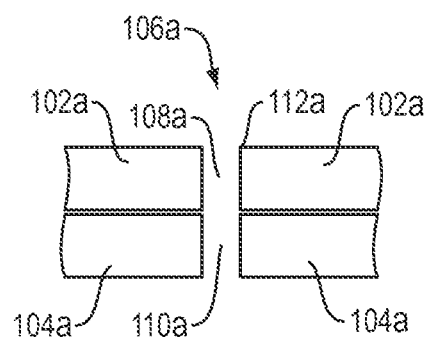
FIGS. 1A through 1C illustrate cross-sectional views of respective target sockets and corresponding geometric entities.
Figure 1B:
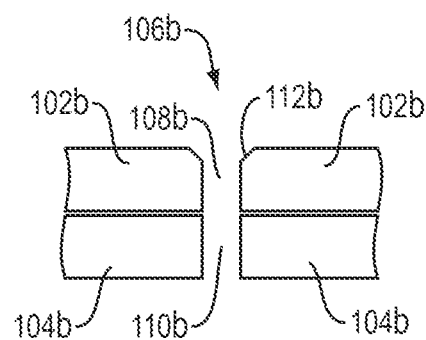
Figure 1C:
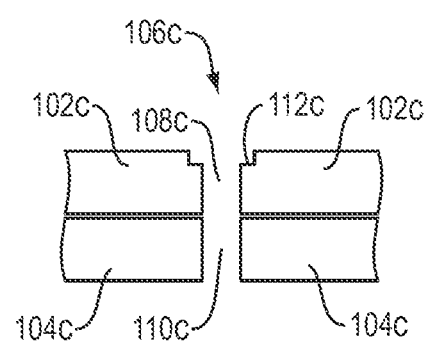

FIGS. 1A, 1B and 1C illustrate three different examples of a target socket according to the described embodiments.

FIG. 1A illustrates a cross-sectional view of a first flange 102a and a second flange 104a with a socket 106a extending through both flanges. The socket 106a includes a first cylindrical void 108a in the first flange 102a and a second cylindrical void 110a in the second flange 104a. The first cylindrical void 108a defines an edge 112a that may be used as the geometric entity described above.

FIG. 1B illustrates a cross-sectional view of a second flange 102b and a second flange 104b with a socket 106b. The socket 106b includes a first cylindrical void 108b in the first flange 102b and a second cylindrical void 110b in the second flange 104b. The first cylindrical void 108b is associated with a conical surface 112b, which may be used as the geometric entity described above.

FIG. 1C illustrates a cross-sectional view of a second flange 102c and a second flange 104c with a socket 106c. The socket 106c includes a first cylindrical void 108c in the first flange 102c and a second cylindrical void 110c in the second flange 104c. The first cylindrical void 108c is associated with an annular surface 112c, which may be used as the geometric entity described above.

FIGS. 1A, 1B and 1C are merely illustrative examples of the geometric entity described herein. It should be recognized that other features or aspects of a socket may also be used as the geometric entity.

When the user selects the geometric entity, the described embodiment performs an operation to auto-select elements of a fastener that would be appropriate for use with the selected geometric entity (for example, the head of a bolt, the thread body of the bolt, a lock washer and a nut, among others). This auto-selection thus provides a general definition of a fastener that is appropriate for the selected geometric entity.

In some embodiments, certain default combinations are enforced, so that selection of a certain geometric entity (such as a conical surface) will automatically be combined with certain other elements (e.g., a conical bolt head, a threaded body and a nut).

Once the general definition of the fastener has been established, the described embodiments extract or auto-calculate specific physical properties of the target socket from the CAD model of the body. Examples of these specific physical properties may include head diameter, nut diameter, length and inside diameter of the target socket, and body radius, among others. In some embodiments, the physical property extraction may include analysis of other bodies adjacent to or associated with the body that includes the target socket. For example, as described above, the target socket may be disposed across a pair of flanges, or within two or more other bodies.

The described embodiments may present the user an option to confirm all of the automatically defined properties. For example, the described embodiments may invite the user to mouse-click or otherwise select a box (or other designator) associated with all of the properties. In another embodiment, the user may be presented with an option to confirm some of the properties, while editing or otherwise modifying others of the automatically defined properties.

Cloning An Individual Fastener

For each individual fastener defined as described above (the base fastener), a user may use another low complexity action (e.g., a 1-button click) to clone the base fastener for use with one or more CAD geometry patterns, existing within the body, that are the same or similar to the target socket.

In one embodiment, a low complexity action generates cloned (i.e., duplicated) fasteners for all CAD geometry patterns of sockets in the body that are the same or similar to the target socket. The cloned fasteners may be visually highlighted in the CAD graphical user interface (GUI) to show the user where each automatically-generated clone may be instantiated.

The described embodiments may present the user an option to confirm the cloned fasteners (such confirmation may be similar to that described above in relation to the automatically-defined properties of the base fastener). The user may be presented choices that facilitate confirmation of all of the cloned fasteners, groups of cloned fasteners or only certain individual fasteners.

To determine which sockets in the body are the same or similar to the target socket, the described embodiments evaluate CAD geometry patterns in the body as compared to the target socket and the base fastener. Once similar sockets in the body are identified, the described embodiments generate a potential clone for each of the similar sockets using the base fastener as a guide. The potential clones may match the base fastener head for head, nut for nut, and corresponding bodies in between.

The described embodiments search the CAD geometry database for a match to the target socket, which the user may specify as either exact or fuzzy. Tests for determining a match may include head diameter, types and dimensions of nuts and bodies, coaxial test with tolerance, best matches with multiple hits by distance, angle, orientation (for example, face normal), among others.

In the described embodiments, a list of the matches (i.e., socket sites for clones) is presented to the user, both as a table and as highlighted regions in the 3D model. For each match, all the physical properties are either copied or fine-tuned (e.g., if the match was fuzzy) from the base fastener to the cloned features, so that a virtual fastener, essentially a clone of the base fastener, is generated for each of the socket matches. Thus, with a single simple action, such as a 1 button mouse click, the user can create clones of the base fastener for all of the similar socket instances This clone feature of the described embodiments may be advantageous for designs that include patterned geometry on the same bodies, because such cloning allows for a large number of virtual fasteners to be created at one time. With selection of another set of bodies, this cloning feature can be extended to other parts of an overall assembly.

While the example embodiments described herein are shown for bolt fastener applications, it may also be used for other fasteners such as pins, springs bearing connectors, and other connectors known in the art.

FIGS. 1D through 7 illustrate an example embodiment of the present invention.

Figure 1D:
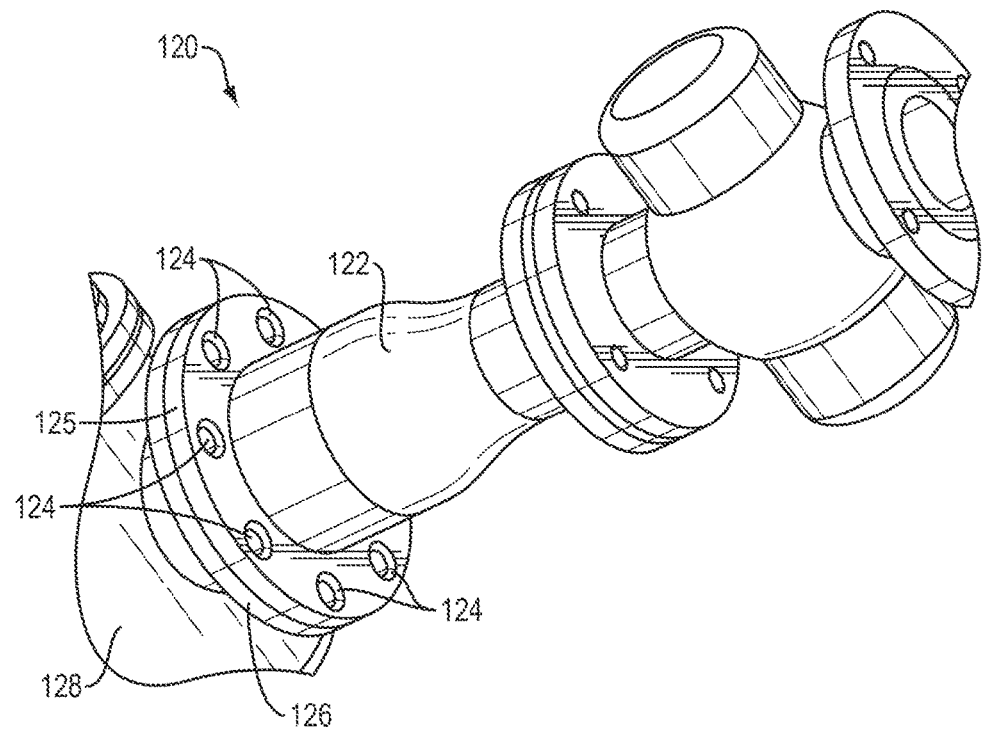
FIG. 1D illustrates an example CAD model of a body having a number of sockets 104 for receiving a fastener according to one aspect of the invention.

FIG. 1D illustrates an example CAD model 120 of a body 122 having a number of sockets 124 for receiving a fastener. The sockets are distributed along a flange 125 portion of the body 122. Although not shown in this figure, the sockets 124 extend through a second flange 126 of body 128 that is adjacent to and in contact with the flange 125 of body 122. At this point in the example, no fastener has yet been modeled for the sockets.

Figure 2:
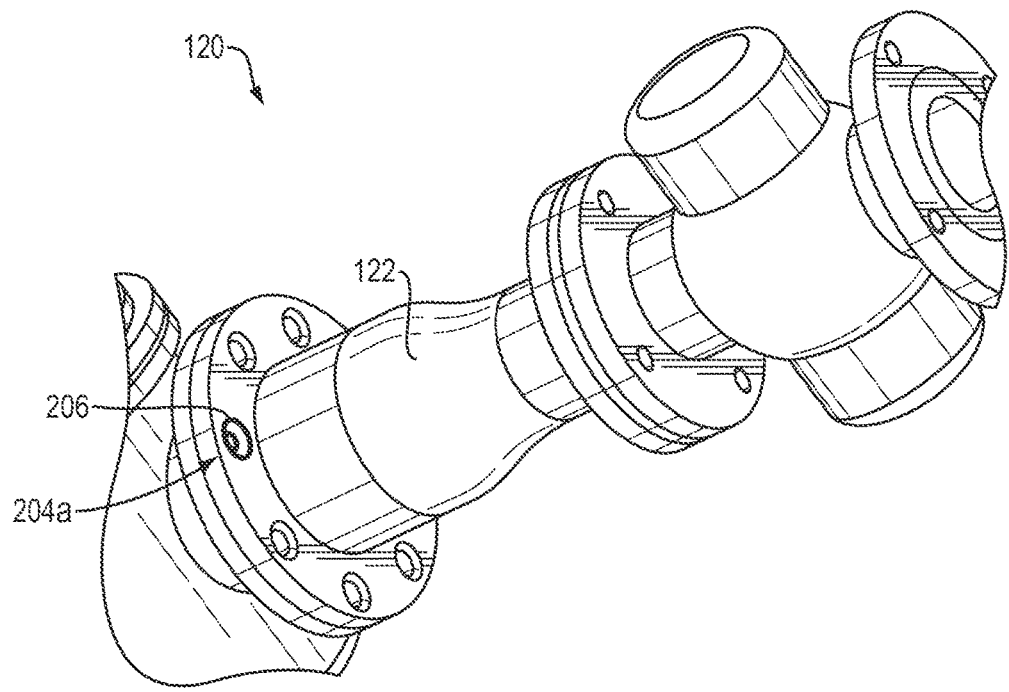
FIG. 2 shows a user selecting a target socket in the example model of FIG. 1.

In FIG. 2, the user selects an aspect of a particular socket 204a as the geometric entity, in this case a conical surface 206, using for example a 1-click selection with a computer mouse or other input device. In some embodiments, the user may associate the 1-click with a command or other indication that the 1-click (or other selection action) is meant to generate a base fastener. In response to the 1-click selection, the described embodiment generates the elements of the fastener (e.g., head, body, threads, nut) that are appropriate for the selected geometric entity, extracts or auto-calculates the physical properties of the socket 204a from the CAD model of the body 122, and modifies the base fastener according to the extracted physical properties.

Figure 3:
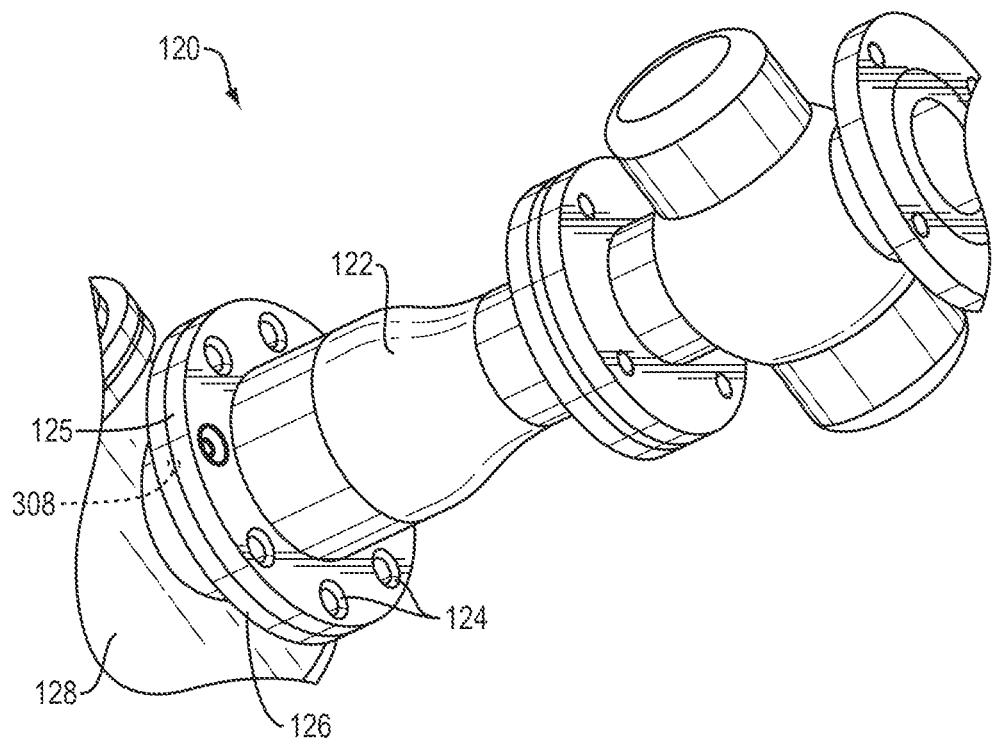
FIG. 3 shows aspects of a generated fastener highlighted, according to an embodiment of the invention, in the example of FIG. 1.

As illustrated in FIG. 3, certain aspects 308 of the socket and its physical properties may be highlighted on the model 120 as visual feedback for the user. As mentioned earlier, the first flange 125 of body 122 cooperates with a second flange 126 of body 128. In the example of FIG. 3, the aspect 308 is an edge of a socket that extends through the second flange 126. The described embodiment thus facilitates creation of a virtual fastener by depicting such aspects (which may normally be hidden) for the CAD user.

Figure 4:
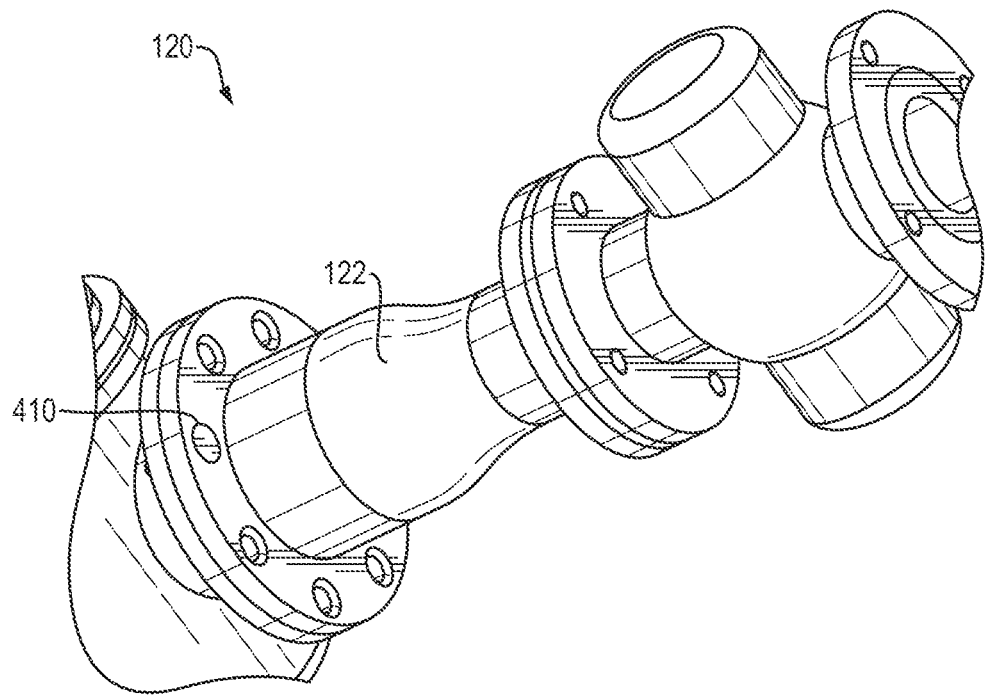
FIG. 4 shows a fastener displayed with the CAD model of the body depicted in FIG. 1.

FIG. 4 shows a 3 dimensional base fastener 410 (i.e., a bolt) displayed with the CAD model of the body 102.

As described earlier with respect to FIG. 1, the body 122 includes a number of sockets 124 distributed along a flange 125. Rather than create individual fasteners for each of the sockets 124, with the described embodiments a user may select the base fastener 410 and perform a low-complexity selection action (e.g., a 1-click with a computer mouse or other input device) to initiate a cloning operation.

Figure 5:
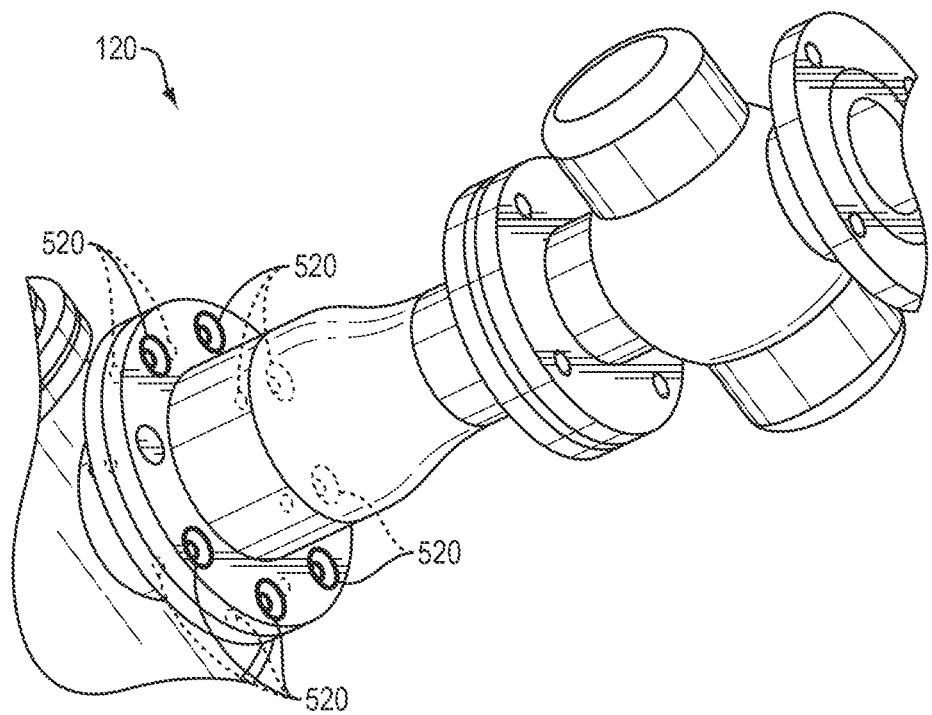
FIG. 5 shows the highlighted results of a search for matching sockets in the body of FIG. 1 according to an aspect of the invention.

As shown in FIG. 5, the described embodiments perform a search of the CAD model geometry (i.e., searching for geometric primitives such as circular holes, coaxial cylinders, etc.) to find sockets that match parameters associated with the selected base fastener (e.g., 410 of FIG. 4). This approach may find many appropriate locations for replication of the initial base fastener 410, no matter what CAD features are used to create the CAD model.

In some embodiments, all matches may be highlighted 520 to provide visual feedback to the user. The described embodiments generate a proposed virtual fastener, essentially a clone of the base fastener, for each of the matches.

Figure 6:
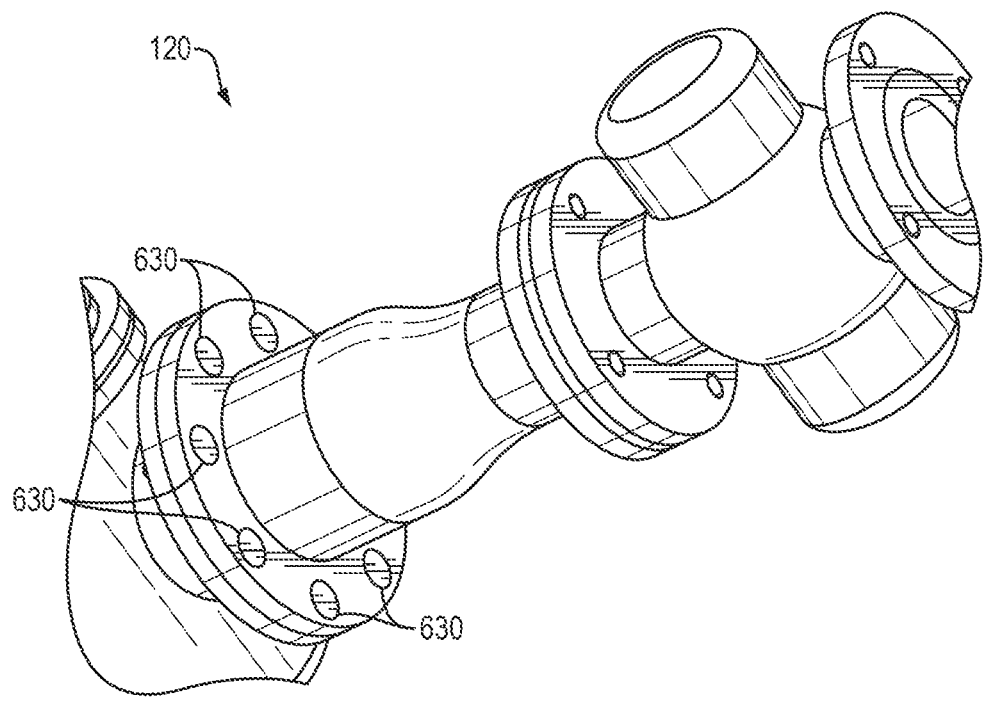
FIG. 6 shows virtual fasteners generated for the matching sockets from FIG. 5.

The user evaluates each of the proposed virtual fasteners, and is given the opportunity to confirm one, some or all of the proposed fasteners. The described embodiment establishes a virtual fastener 630 for each that is confirmed by the user, as shown in FIG. 6.

Figure 7:
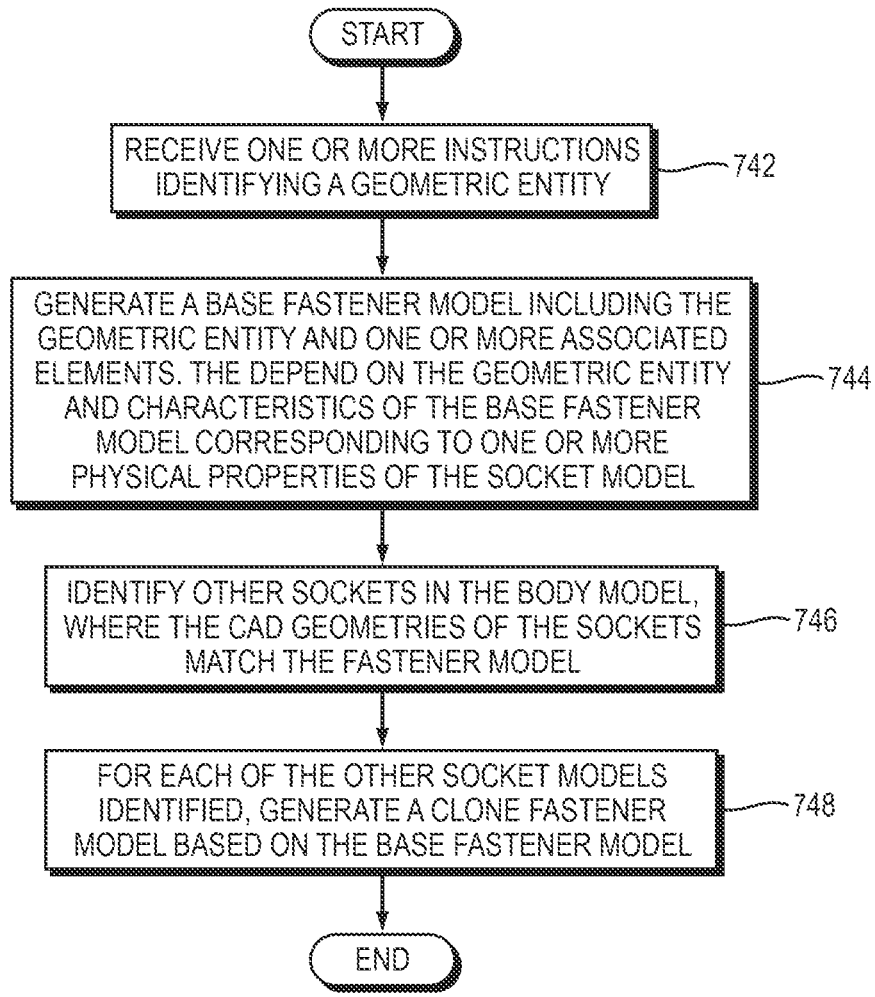
FIG. 7 shows example operation elements according to an embodiment of the invention.

FIG. 7 illustrates an example procedure to generate and clone a model of a physical fastener according to the described embodiments. Although this example embodiment depicts the use of a computer-aided design (CAD) system, it should be understood that the concepts described herein may also be applicable to other suitable systems such as a simulation (e.g., FEA) system or general purpose computer system.

In this example, a CAD system receives 742 one or more instructions identifying a geometric entity. The CAD system generates 744 a base fastener model including the geometric entity and one or more associated elements. The one or more associated elements depend on the geometric entity and characteristics of an associated socket model. The CAD system identifies 746 other sockets in the body model, where the CAD geometries of the sockets match the fastener model. For each of the other socket models identified, the CAD system generates 748 a clone fastener model based on the base fastener model.

It will be apparent that one or more embodiments described herein may be implemented in many different forms of software and hardware. Software code and/or specialized hardware used to implement embodiments described herein is not limiting of the embodiments of the invention described herein. Thus, the operation and behavior of embodiments are described without reference to specific software code and/or specialized hardware—it being understood that one would be able to design software and/or hardware to implement the embodiments based on the description herein.

Further, certain embodiments of the example embodiments described herein may be implemented as logic that performs one or more functions. This logic may be hardware-based, software-based, or a combination of hardware-based and software-based. Some or all of the logic may be stored on one or more tangible, non-transitory, computer-readable storage media and may include computer-executable instructions that may be executed by a controller or processor. The computer-executable instructions may include instructions that implement one or more embodiments of the invention. The tangible, non-transitory, computer-readable storage media may be volatile or non-volatile and may include, for example, flash memories, dynamic memories, removable disks, and non-removable disks.

Figure 8:
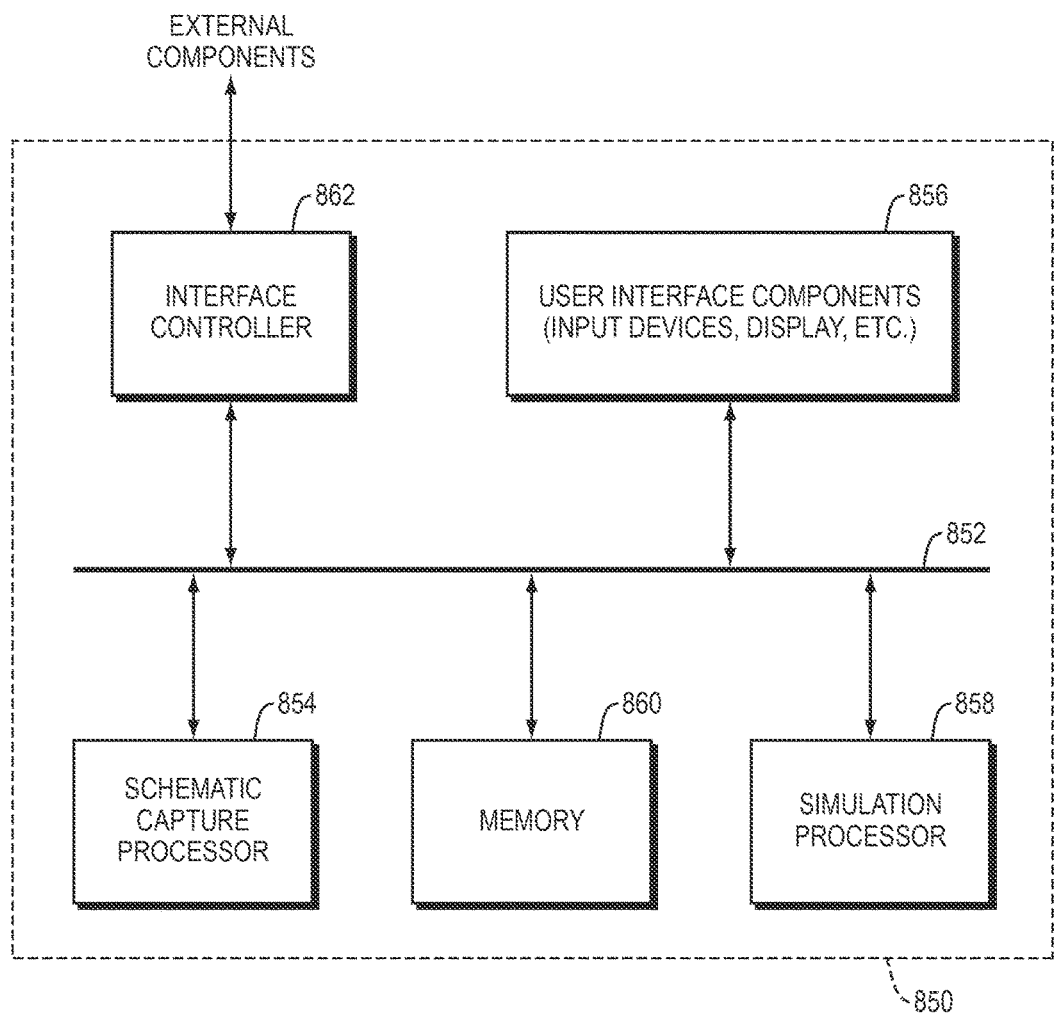
FIG. 8 shows an example CAD system constructed and arranged according to the described embodiments.

FIG. 8 illustrates an example CAD system 850 according to the described embodiments. The example CAD system includes a bus 852 through which other components of the system communicate with one another. The schematic capture processor 854 provides the processing capability for generating the structural model from instructions received from the user through the user interface components 856. The simulation processor 858 provides the processing capability for executing the simulations described herein. Both the schematic capture processor 854 and the simulation processor 858 communicate through the bus 852 with memory 860, which stores instructions to be run by the processors 854, 858, and provides data storage services required by the processors. Other functions performed by the CAD system 850 may be accomplished by either of the processors 854, 858 or by a combination of both, or by another processor (not shown), alone or combined with the other processors. The CAD system may also include an interface controller 862 for facilitating communications with entities outside of the CAD system, such as external memory, other CAD workstations, or network components.

While this invention has been particularly shown and described with references to example embodiments thereof, it will be understood by those skilled in the art that various changes in form and details may be made therein without departing from the scope of the invention encompassed by the appended claims.

What is claimed is:

1. A method of generating a model of a physical fastener, comprising:
   receiving, by a computer-aided design (CAD) system, one or more instructions identifying a geometric entity associated with a target socket;
   generating, by the CAD system, an original, base fastener model comprising aspects of the geometric entity and one or more associated elements, the one or more associated elements depending on the geometric entity and characteristics of a socket model of the target socket.

2. The method of claim 1, wherein the geometric entity relates to at least a portion of an element of a fastener.

3. The method of claim 2, wherein the geometric entity relates to a bolt head, and the one or more associated elements represent at least one of a threaded body and a nut.

4. The method of claim 1, wherein the one or more instructions are derived from a user performing a low-complexity action.

5. The method of claim 4, wherein the low-complexity action includes a single click of a computer mouse.

6. The method of claim 1, wherein the association between the geometric entity and the socket model indicates a specific fastener to be used with a socket that the socket model represents.

7. The method of claim 1, wherein characteristics of the fastener model correspond to at least one physical property derived from the socket model.

8. The method of claim 7, wherein the at least one physical property includes one or more of head diameter, nut diameter, length of the socket, inside diameter of the socket, and body radius.

9. The method of claim 1, further including creating a clone fastener model based on the generated fastener model.

10. The method of claim 9, wherein characteristics of the clone fastener model correspond to at least one physical property of the socket model.

11. A method of cloning models of a physical fastener, comprising:
    receiving, by a computer-aided design (CAD) system, one or more instructions identifying a geometric entity associated with a first socket model;
    generating an original, base fastener model comprising aspects of the geometric entity and one or more associated elements, the one or more associated elements depending on the geometric entity and characteristics of a socket model of the first socket model;
    for each of one or more socket models, other than the first socket model, having at least one characteristic corresponding to the base fastener model, generating, by the CAD system, a clone fastener model as a function of the base fastener model and at least one physical property of the one or more socket models.

12. The method of claim 11, wherein the one or more instructions are derived from a user performing a low-complexity action.

13. The method of claim 12, wherein the low-complexity action includes a single click of a computer mouse.

14. The method of claim 11, further comprising determining the one or more socket models within the body model by searching the body model for geometric primitives corresponding to the base model of a physical fastener and identifying socket models that match the base model of a physical fastener.

15. The method of claim 14, wherein the match between the socket model and the base model of a physical fastener is an exact match.

16. The method of claim 14, wherein the match between the socket model and the base model of a physical fastener is a fuzzy match.

17. The method of claim 11, further including modifying one or more physical parameters of the clone fastener to match the associated socket model.

18. The method of claim 11, wherein the one or more socket models within the body model are presented to the user as highlighted images in a graphical user interface of the CAD system.

19. A non-transitory computer-readable medium with computer code instruction stored thereon, the computer code instructions when executed by an a processor cause an apparatus to:
    receive one or more instructions identifying a geometric entity associated with a target socket;

generate an original, base fastener model comprising aspects of the geometric entity and one or more associated elements, the one or more associated elements depending on the geometric entity and characteristics of a socket model of the target socket.

20. A non-transitory computer-readable medium with computer code instruction stored thereon, the computer code instructions when executed by an a processor cause an apparatus to:

receive one or more instructions identifying a geometric entity associated with a first socket model;

generate an original, base fastener model comprising aspects of the geometric entity and one or more associated elements, the one or more associated elements depending on the geometric entity and characteristics of a socket model of the first socket model;

for each of one or more socket models, other than the first socket model, having at least one characteristic corresponding to the base fastener model, generate a clone fastener model as a function of the base fastener model and at least one physical property of the one or more socket models.

\* \* \* \* \*